United States Patent [19]

Whitehouse

[11] 4,411,703

[45] Oct. 25, 1983

[54] COMPOSITION FOR APPLYING ANTIREFLECTIVE COATING ON SOLAR CELL

[75] Inventor: Daniel L. Whitehouse, Clarksburg, Md.

[73] Assignee: Solarex Corporation, Rockville, Md.

[21] Appl. No.: 341,128

[22] Filed: Jan. 20, 1982

Related U.S. Application Data

[62] Division of Ser. No. 227,929, Jan. 23, 1981, Pat. No. 4,328,260.

[51] Int. Cl.$^3$ .................. C08L 1/28; C07F 7/28; B05D 1/18
[52] U.S. Cl. .................. 106/189; 106/193 R; 106/197 R; 106/287.19; 427/74; 427/226
[58] Field of Search .......... 106/197 C, 287.15–287.17, 106/193, 189, 287.19; 260/429.1, 448 AD; 427/226, 74

[56] References Cited

U.S. PATENT DOCUMENTS

| | | | |
|---|---|---|---|
| 2,838,418 | 6/1958 | Starkweather | 427/226 |
| 4,180,449 | 12/1979 | Heikel | 427/226 |
| 4,232,062 | 11/1980 | Okino | 427/226 |
| 4,286,024 | 8/1981 | Yoldas | 428/446 |
| 4,328,260 | 5/1982 | Whitehouse | 427/74 |
| 4,361,598 | 11/1982 | Yoldas | 427/106 |

*Primary Examiner*—Theodore Morris
*Attorney, Agent, or Firm*—Watson, Cole, Grindle & Watson

[57] ABSTRACT

A method, and the composition, for the application of an antireflective coating on solar cells and the subsequent application of metal contacts comprising applying a screen to the surface of a solar cell, applying a paste comprising a metal alkoxide over the screen, heat treating the cell and metal alkoxide paste, and nickel plating the resultant cell.

5 Claims, No Drawings

COMPOSITION FOR APPLYING ANTIREFLECTIVE COATING ON SOLAR CELL

This is a division of application Ser. No. 227,929 filed Jan. 23, 1981, now U.S. Pat. No. 4,328,260.

The present invention relates generally to solar energy cells and more specifically to antireflective coatings for such cells and a method of applying such coatings.

In a semiconductor device, a silicon wafer that has previously been doped with an impurity to adopt a specific polarity, is subjected to an impurity of the opposite polarity, thus forming an electrical junction. As a specific example, if the silicon wafer is previously doped with boron, thus establishing a p-type polarity, a subsequent diffusion of phosphorus will result in a wafer having a p-n junction near one surface.

A junction having been established, radiant energy, usually in the form of light impinging on the surface, is rapidly absorbed as it penetrates the semiconductor material generating free electrons and holes in pairs. The minority carriers of the hole-electron pairs, in the region of their generation, either recombine with the majority carriers or cross the p-n junction. Those minority carriers which cross the p-n junction cause the cell body to become biased, the electrons flowing into the N-type region and the holes into the p-type region. This bias results in the generation of a useful electrical current which flows when the two regions are connected externally by an electrical conductor.

The efficiency, that is, power output/power imput of a solar cell is directly related to the amount of useful light (carrier generating light), which is absorbed by the solar cell. The efficiency of the solar cell is limited because some of the light, both useful and nonuseful, striking the top surface of the cell is reflected. To reduce this reflection an antireflective coating is positioned on the surface of the solar cell through which light enters the cell. A properly functioning antireflective coating must reduce reflection of the useful light and must not absorb the useful light, but should enable the light to pass to the underlying cell. The use of a particular antireflective material is therefore dependent upon the reflective index of the underlying solar cell, as well as the absorption band wavelengths for that solar cell.

Prior art methods of applying antireflective coatings include evaporating the metal by means of an electron beam and then thermally or anodically oxidizing the metal to its oxide, while on the silicon; evaporating the metal oxide directly onto the surface of the solar cell; and by electron beam evaporation of mixtures of the metal and its oxide. These methods are unsatisfactory for many reasons including the requirement for expensive and complicated equipment, such as high vacuum, for the evaporation of the metals and/or their oxides, and the difficulty in the control of the thickness of the antireflective coating deposited on the cell. A further difficulty encountered by the prior art processes is that some antireflective coatings may have to be removed in order to apply metal contacts (grid).

In the present invention a means was developed for the deposition of an antireflective coating which does not require sophisticated equipment and does not require removal of said coating to deposit metal contacts (grid) to said cell.

In the process of this invention a paste of a metal organic salt is screen-printed onto the surface of the cell and the metal organic salt converted to its oxide by heat treatment. Upon removal of the screen, the surface of the cell under the solid portion of the screen is free of the coating and thus a metal contact can be added.

The metal organic salts normally utilized are the alkoxides, such as methoxide, ethoxide, n-propoxide, isopropoxide, butoxide and pentyloxide. The limitation as to the chain length of the alkoxide is governed by its ease of production and decomposition. At the temperatures utilized in the heat treatment step, the alkoxide moiety combustion products are mainly water and carbon dioxide. Aryloxides are not normally utilized because of the difficulty in obtaining complete decomposition as in the case of alkoxides.

The metal utilized in this process is selected from the group consisting of tantalum, niobium, titanium, tellurium, zirconium and yttrium or combinations of these metals.

The characteristics of the coating obtained, such as index of refraction, dielectric constant, hardness, porosity, light absorbtion, chemical stability and other chemical, physical, electronic and optical properties, can be selected by the proper selection of the alkoxide preparation for the particular cell to be coated.

The thickness of the coating obtained is easily determined by the amount of alkoxide paste utilized and is preferrably approximately one-quarter wavelength of light energy having a wavelength in the range of about 0.5 to 0.75 micron. The actual thickness of the coating obtained can be determined by the various known instruments which are available for that purpose.

In the preparation of the metal organic paste a thickening or suspension agent, such as ethyl cellulose and methyl cellulose, is mixed with a compatible liquid forming a paste. The liquid, which acts as a solvent for the alkoxide, most commonly utilized is an aliphatic alcohol having at least six carbon atoms, such as 2-ethylhexanol-1, or a terpene, such as α - terpineol. Other known liquid alcohols, such as benzyl alcohol and other aromatic alcohols, terpenes and thickening or suspension agents, can also be utilized.

To this paste is added either a metal alkoxide or a mixture of the metal chloride and the alcohol. In neither case must all the halogens of the metal be replaced by an alcohol group. Depending on the metal selected, when the metal and alcohol is added as a mixture, there is either a reaction between the two components or a complex of the two components or possibly both. The ratio of the metal halide to alcohol, in a mixture of the two components or in an alkoxide, is in the ratio of about 1/1 to about ⅓, with a preferred ratio of ½.

The preferred ratio of thickening agent to alcohol utilized to form an acceptable paste is in the range of about 2/1 to about 1/20. The preferred ratio of paste to metal alkoxide or mixture is in the range of about 10/1 to 50/1.

As a specific example of the practice of this invention, a paste is prepared from 1 part ethyl cellulose and 1.5 parts α- terpineol. To 20 parts of the resultant paste is added 1 part of a mixture of 1 part niobium chloride ($NbCl_5$) to 2 parts ethanol. The resulting, essentially homogeneous paste is then spread over a screen which has been placed on the light impinging surface of the cell. The screen is open except for the areas which are to form the grid. The thickness of the screen is such that it will permit sufficient paste to be added to the open space of the screen to leave a coating, after heat treatment, of approximately an one-quarter wavelength. This thickness is easily determinable by known methods.

After the paste was applied to the cell, the screen was removed and the cell was heated in the range of about 400° C. to 550° C. for approximately 1 to 10 minutes. Following the heat treatment the cell is plated with a standard nickel plating solution, thus forming the grid structure.

This procedure was repeated using a mixture of 1 part ethylcellulose to 1.5 parts 2-ethylhexanol-1 as the components of the paste and either a 1 to 3 tantalum chloride-ethanol mixture or titanium ethoxide. The ratio of paste to metal-alcohol mixture was 15/1 and the ratio of paste to titanium ethoxide was 25/1. In both procedure the thickness of the resultant oxide coating was in the range of about 0.5 to about 0.75 microns.

As an embodiment of this invention the screen may be removed after heat treatment of the cell. In this embodiment the screen material is composed of material which will withstand heat in the range of about 300° C. to about 550° C. Material of this nature is known. It is preferred however, that the screen be removed prior to the heat treatment.

The reference to parts and ratios in the specification and claims is expressed or based on parts by weight.

While the present invention has been described with respect to a preferred mode thereof, it will be apparent that numerous alterations and modifications will be apparent to those skilled in the art without departing from the spirit of the invention. As to all such obvious alterations and modifications, it is desired that they be included within the purview of my invention, which is to be limited only by the scope, including equivalents, of the following appended claims.

I claim:

1. A composition suitable for application onto the light impinging surface of a solar energy cell for forming an antireflective coating thereon, comprising:
   (a) a thickening or suspension agent selected from the group consisting of methylcellulose and ethylcellulose;
   (b) a liquid alcohol selected from the group consisting of aliphatic alcohols having at least six carbon atoms, terpenes and aromatic alcohols; and
   (c) a metal alkoxide, said metal being selected from the group consisting of tantalum, titanium, niobium, yttrium, zirconium, tellurium and mixtures thereof.

2. A composition as claimed in claim 1, in which the ratio of thickening or suspension agent to alcohol is about 2/1 to about 20/1 and ratio of (a) thickening or suspension agent and alcohol to (b) metal alkoxide is about 10/1 to about 50/1.

3. A composition as claimed in claim 1 in which the alkoxide moiety is selected from the group consisting of methoxide, ethoxide, n-propoxide, iso-propoxide, butoxide and pentyloxide.

4. A composition as claimed in claim 1 in which the alcohol is selected from the group consisting of 2-ethylhexanol-1 and α-terpineol.

5. A composition as claimed in claim 1 in which the metal alkoxide is a mixture of the metal chloride and an alcohol and the ratio of metal chloride to alcohol is in the range of about 1/1 to about 1/3.

* * * * *